United States Patent [19]
Higashide et al.

[11] Patent Number: 5,875,089
[45] Date of Patent: *Feb. 23, 1999

[54] INPUT PROTECTION CIRCUIT DEVICE

[75] Inventors: Yoshiko Higashide; Shigeki Ohbayashi, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 636,004

[22] Filed: Apr. 22, 1996

[51] Int. Cl.$^6$ ............................................. H02H 3/22
[52] U.S. Cl. ............................ 361/111; 361/56; 257/355
[58] Field of Search ........................ 361/56, 111, 91, 361/86; 257/355, 361

[56] References Cited

U.S. PATENT DOCUMENTS

| | | | |
|---|---|---|---|
| 4,736,271 | 4/1988 | Mack et al. | 361/91 |
| 5,079,612 | 1/1992 | Takamoto et al. | 361/91 |
| 5,596,216 | 1/1997 | Yanagigawa | 257/355 |
| 5,610,790 | 3/1997 | Staab et al. | 361/56 |
| 5,629,545 | 5/1997 | Leach | 257/362 |

FOREIGN PATENT DOCUMENTS

| | | |
|---|---|---|
| 1-225361 | 3/1988 | Japan . |
| 3-272180 | 3/1990 | Japan . |

*Primary Examiner*—Jeffrey Gaffin
*Assistant Examiner*—Michael J. Sherry
*Attorney, Agent, or Firm*—McDermott, Will & Emery

[57] ABSTRACT

An input protection circuit device for protecting a device in a semiconductor circuit device when a surge current is applied to a signal input terminal of the semiconductor circuit device is provided. The input circuit device includes an nMOS transistor between an input signal line connecting an input pad and an internal circuit and a first power supply (Vcc), and having a gate electrode connected to GND via a resistor-C, and a diode between the input signal line and GND. When a positive surge current higher than the potential of the first power supply (Vcc) is applied to the input pad, and when a negative surge current lower than the potential of GND is applied, the surge current is moderated by the nMOS transistor and by the diode, respectively, to prevent the flow of the surge current to the internal circuit.

16 Claims, 17 Drawing Sheets

INPUT PROTECTION CIRCUIT DEVICE

BACKGROUND OF THE INVENTION

1. Field of the Invention

The present invention relates to input protection circuit devices, and more particularly, to a structure of a protection circuit unit and arrangements of a signal input unit and a power supply potential input unit.

2. Description of the Background Art

The problem of the so-called electrostatic breakdown in which internal devices are damaged when a surge current is applied to an input pad or the like or when a surge current is applied to the power supply during operation of a semiconductor device is encountered in the manufacturing process of a semiconductor device. An input protection circuit device is provided to protect the internal device from such a surge current.

An example of a conventional input protection circuit device will be described hereinafter with reference to FIG. 20.

An input protection circuit device includes a first resistor 103 and a second resistor 104 connected in series in an input signal line 109 connecting an input signal pad 106 and an internal circuit 108, and field transistors 101 and 102 connected between the portion of input signal line 109 between first and second resistors 103 and 104 and a power supply (Vcc) 105 or ground GND 107, respectively. First resistor 103 is formed of a polysilicon. Field transistor 101 has its source side connected to input signal line 109, and its drain side connected to power supply (Vcc) 105. Field transistor 102 has its drain side connected to input signal line 109 and its source side connected to GND 107. The potential of the each gate thereof is not fixed, and attains a floating state.

When a surge current higher than the potential of power supply (Vcc) 105 is applied from input pad 106 in the above-described structure, a depletion layer expands between the source and drain of field transistor 101 to provide electrical connection therebetween. When a surge current lower than the potential of GND 107 is applied, a depletion layer between the source and drain of field transistor 102 expands to provide electrical connection therebetween. Therefore, the potential of input signal line 109 between first and second resistors 103 and 104 is maintained at a level between the voltage of power supply (Vcc) 105 and the potential of GND 107. In this way, the surge current applied to input pad 106 is prevented from flowing towards internal circuit 108.

To accommodate for the trend of larger scale integration and high density in recent devices, miniaturization in the interconnection wiring connecting semiconductor circuit devices is effected. Such miniaturization of interconnection wiring induces the problem of degrading the endurance of electrostatic breakdown. Increase in the integration density is required also in an input protection circuit device corresponding to devices scaled to higher densities.

Another example of an input protection circuit device of a case in which a surge current is applied to the power supply of the semiconductor device will be described.

Referring to FIG. 21, this input protection circuit includes a diode 110 connected between power supply (Vcc) 105 and GND 107.

Such an input protection circuit relates greatly to a problem inherent in recent semiconductor devices including a CMOS transistor directed to reduce power consumption. More specifically, there is a problem of a latch up phenomenon associated with miniaturization of devices including a CMOS transistor.

FIG. 22 shows a sectional view and an equivalent circuit of a CMOS device. Referring to FIG. 22, this device includes a pMOS transistor 111 formed on an n type substrate 115, and an nMOS transistor 112 formed on a P well 116 of n type substrate 115. Power supply (Vcc) 105 is connected to a $p^+$ diffusion layer 113 of pMOS transistor 111, and an $n^+$ diffusion layer 114 of nMOS transistor 112 is connected to GND 107. A p-n-p structure is formed by $p^+$ diffusion layer 113, n type substrate 115, and P well 116. An n-p-n structure is formed by $n^+$ diffusion layer 114, P well 116 and n substrate 115. These can be regarded as a lateral type p-n-p bipolar transistor and a vertical type n-p-n bipolar transistor formed parasitically in a CMOS device. These two bipolar transistors function as a thyristor, whereby a current flows from $p^+$ diffusion layer 113 towards n substrate 115 by a surge current applied to power supply (Vcc) 105. Difference in potential between $p^+$ diffusion layer 113 and n type substrate 115 is generated to cause current to flow from $p^+$ diffusion layer 113 towards P well 116. Here, difference in potential between n type substrate 115 and P well 116 is generated to cause a flow of a current of a greater level from n type substrate 115 towards $n^+$ diffusion layer 114. Thus, the current of power supply (Vcc) 105 induces the latch up phenomenon towards GND 107.

FIG. 23 shows the flow of current 130 from power supply (Vcc) 105 towards GND 107.

Such a latch up phenomenon is occurring more frequently since the distance between $p^+$ diffusion layer 113 and P well 116 and also the distance between $n^+$ diffusion layer 114 and n type substrate 115 are reduced as the CMOS device is increased in integration density. This means that even a surge current of a low level will trigger the generation of a latch up phenomenon.

A further example of an input protection circuit device applied in the power supply of a static random access memory (referred to as SRAM hereinafter) will be described hereinafter.

FIG. 24 is a block diagram showing a structure of a general SRAM. Referring to FIG. 24, an SRAM 126 includes a memory cell array 117 for storing a data signal of stored information, a row address buffer 118 and a column address buffer 119 for receiving an external address signal to select a memory cell forming a unitary storage circuit, a row decoder 120 and a column decoder 121 for specifying a memory cell by decoding the received address signal, a sense amplifier 122 for amplifying and reading out the signal stored in the specified memory cell, a data input/output buffer 123 for data input/output, a R/W control circuit 124 for controlling reading/writing, and a write driver 125 for writing information. SRAM 126 operates by power supply (Vcc) 105.

In order to prevent any erroneous operation due to noise, some recent SRAMs have a power supply for the data input output circuit in data output buffer 123 provided independent of the power supply for the other input circuits. More specifically, the SRAM includes two types of power supplies for the output circuit (Vccq) and for the internal circuit (Vcc).

FIG. 25 is a sectional view and an equivalent circuit diagram of a CMOS transistor used as an output transistor in an output circuit of such an SRAM. Referring to FIG. 25, the structure of the output circuit of the SRAM is basically similar to that of FIG. 22, provided that a second power supply (Vccq) 127 is connected to $p^+$ diffusion layer 113 of pMOS transistor 111, and first power supply (Vcc) 105 is connected to n type substrate 115 via an n+ diffusion layer 128 formed in n type substrate 115. The set voltage has a relationship of first power supply (Vcc) >second power supply (Vccq). For example, Vcc=3.3 V and Vccq=2.5 V are set.

In powering on the external power supply of the SRAM and turning on the first power supply (Vcc) and the second power supply (Vccq) in the above-described structure, there is a possibility that the second power supply (Vccq) becomes higher than the first power supply (Vcc) in transition. In this case, the output transistor may induce a latch up phenomenon, similar to that described with reference to FIGS. 22 and 23. More specifically, referring to FIG. 25, a current flows from p+ diffusion layer 113 of pMOS transistor 111 to which second power supply (Vccq) 127 is connected towards n type substrate 115 or n+ diffusion layer 128. Therefore, a potential difference between p+ diffusion layer 113 and n type substrate 115 is generated to cause a current to flow from p+ diffusion layer 113 towards P well 116. Also, the potential difference between n type substrate 115 and P well 116 is generated to cause a flow of a greater current from n type substrate 115 to n+ diffusion layer 114.

Thus, there is a problem that the current flowing from p+ diffusion layer 113 towards P well 116 due to the potential of the second power supply (Vccq) becoming higher than that of the first power supply (Vcc) will trigger a latch up phenomenon of an output transistor.

Degradation in the electrostatic breakdown endurance due to miniaturization of the interconnection wiring according to increase in integration density of devices cannot be prevented in a conventional input protection circuit device. It was also not possible to sufficiently prevent the generation of a latch up phenomenon in an output transistor of a device by a surge current applied to the power supply. Furthermore, generation of a latch up phenomenon in an output transistor of a device having two different potentials of power supplies for noise measures cannot be prevented in the case where the relation of the set potentials of the two different power supplies is reversed.

SUMMARY OF THE INVENTION

In view of the foregoing, an object of the present invention is to provide an input protection circuit device for sufficiently protecting an internal device from a surge current when such a surge current is applied to a signal input of a semiconductor device.

Another object of the present invention is to provide an input protection circuit for protecting an internal device from a surge current when such a surge current is applied to the power supply of a semiconductor device.

A further object of the present invention is to provide an input protection circuit device for protecting an internal device in a semiconductor device including two types of power supplies when the relationship of the set voltages of the two power supplies voltages is reversed.

According to a first aspect of the present invention, an input protection circuit device is applied in a semiconductor circuit device that is connected to a power supply terminal, a ground terminal, and a signal input terminal. The input protection circuit device includes a protection circuit unit and a signal input unit. The protection circuit unit includes a signal transmission path portion, a transistor, and a diode. The signal transmission path portion electrically connects the signal input unit and the semiconductor circuit device. The transistor is connected between the signal transmission path portion and the power supply. The diode is connected between the signal transmission path portion and the ground potential. The transistor has its source connected to the signal transmission path portion, and its drain connected to the power supply potential, and its gate electrode connected to the ground terminal via a first resistor. The diode is connected in a forward direction from the ground terminal towards the signal transmission path portion. The signal input unit is electrically connected to the signal input terminal.

When a positive surge current of a voltage higher than the potential of the power supply is applied to the signal input unit of the above structure, the surge current flows through the signal transmission path portion to cause increase in the potential of the source of the transistor connected to the signal transmission path portion. The gate electrode is connected to ground via the first resistor to have its potential increased by the parasitic capacitance of the electrode structure. As a result, the transistor is turned on to cause the surge current to flow from the source towards the drain. Therefore, the flow of the surge current towards the semiconductor circuit device can be prevented.

When a negative surge current of a voltage lower than the ground potential is applied to the signal input unit, the potential of the transmission path portion will become lower than the ground potential. As a result, current flows through the diode provided in a forward direction from the ground terminal towards the signal transmission path portion. Therefore, the negative surge current is moderated to suppress the influence of the negative surge current on the semiconductor circuit device. Preferably, the product between the parasitic capacitance of the gate electrode and the source and the resistance of the first resistor is set to a value smaller than the cycle time of the semiconductor circuit device. According to this structure, the time of the flow of the surge current from the source and drain of the transistor becomes shorter than the cycle time to eliminate influence on the operation of the semiconductor circuit device.

According to a second aspect of the present invention, an input protection circuit device is applied to a semiconductor circuit device that is connected to a power supply terminal, a ground terminal, and a signal input terminal. The input protection circuit device includes a protection circuit unit and a signal input unit. The protection circuit unit includes a first impurity region of a second conductivity type, a pair of second impurity regions of a first conductivity type, a third impurity region, and a first gate electrode. The first impurity region of the second conductivity type is formed at a main surface of a semiconductor substrate of the first conductivity type. The pair of second impurity regions of the first conductivity type are formed on the main surface and spaced apart from each other within the first impurity region. The first gate electrode is formed on the main surface sandwiched by the pair of the second impurity regions with an insulation film thereunder. The third impurity region is formed so as to surround the first impurity region at the main surface. The impurity concentration of the third impurity region is higher than that of the semiconductor substrate of the first conductivity type. The signal input unit and the signal input terminal are electrically connected. The signal input unit is electrically connected to one of the pair of second impurity regions. That one second impurity region is electrically connected to the semiconductor circuit device via a second resistor. The power supply terminal is connected to the other of the pair of second impurity regions and also to the third impurity region. The ground terminal is connected to the first impurity region, and also to the first gate electrode via the first resistor. The protection circuit unit is arranged adjacent to the signal input unit.

When a positive surge current of a voltage higher than the potential of the power supply is applied to the signal input unit in the above-described structure, the potential of one of the pair of second impurity regions corresponding to the source of the transistor of the first aspect rises. The first gate electrode is connected to ground via the first resistor. The potential of the first electrode rises according to the parasitic capacitance of the insulation film beneath the first gate electrode. As a result, a channel region is formed at a first impurity region in the vicinity of a region right beneath the insulation film. A surge current flows from one of the pair of second impurity regions towards the other region of the pair of second impurity regions corresponding to the drain of the transistor of the first aspect. Therefore, the flow of a surge current towards the semiconductor circuit device via the second resistor can be prevented.

When a negative surge current of a voltage lower than the ground voltage is applied to the signal input unit, the potential of one of the pair of second impurity regions becomes lower than the ground potential. As a result, the transistor formed of a region of the first conductivity type of the semiconductor substrate, the first impurity region of the second conductivity type, and one of the second impurity regions of the first conductivity type is turned on. Thus, a current flows from the third impurity region of the first conductivity type connected to the power supply towards the first impurity region of the second conductivity type. This current further flows from the first impurity region towards one of the second impurity regions to moderate the negative surge current. Thus, influence of the negative surge current on the semiconductor circuit device can be suppressed. It is to be noted that the first impurity region and one of the second impurity regions correspond to the diode of the first aspect provided in a forward direction from the first impurity region towards one of the second impurity regions. Since the third impurity region is arranged so as to surround the first impurity region at the main surface, the flow of current from the power supply can be effected in the vicinity of the first impurity region. This prevents such an external current from flowing towards the input protection circuit device when the semiconductor substrate is connected to the power supply potential. It is therefore possible to prevent the generation of a latch up phenomenon triggered by the flow of such a current in circuitry including an output transistor as an erroneous operation of circuitry other than the protection circuit unit. Preferably, the protection circuit unit further includes a fourth impurity region of a second conductivity type so as to surround the third impurity region at the main surface. The ground terminal and the fourth impurity region can be electrically connected. In this case, an erroneous operation of the semiconductor circuit device can be suppressed more effectively since such a current flows through a region surrounded by the fourth impurity region. Preferably, the protection circuit unit further includes a fifth impurity region of the second conductivity type formed within the first impurity region at the main surface spaced from the other of the second impurity regions, and a second gate electrode formed on the main surface sandwiched by the fifth impurity region and the other of the pair of second impurity regions with an insulation film thereunder. The signal input unit can be connected to the fifth impurity region and the second electrode to the first electrode. In this case, a greater amount of current from the power supply can be conducted from the first impurity region towards the one second impurity region and the fifth impurity region. Accordingly, the surge current is further moderated. The two transistors including the first and second gate electrodes, the pair of second impurity regions, and the fifth impurity region commonly share the other of the pair of second impurity regions. Therefore, the integration density of the protection circuit unit can be increased. More preferably, the product between the parasitic capacitance of the insulation film sandwiched by the first gate electrode and the main surface and the resistance of the first resistor can be set to a value lower than the cycle time of the semiconductor circuit device. According to the structure, the time of flow of the surge current from one of the second impurity regions towards the other of the second impurity regions becomes shorter than the cycle time. Therefore, there is no influence on the operation of the semiconductor circuit device.

According to a third aspect of the present invention, an input protection circuit device is applied to a semiconductor circuit device that is connected to a power supply terminal and a ground terminal. The input protection circuit device includes a power supply potential input unit, a ground potential application unit, and a protection circuit unit. The protection circuit unit includes a field transistor connected between a power supply potential input unit and the ground potential application unit. The field transistor has its drain connected to the power supply potential input unit and its source connected to the ground potential application unit. The power supply potential input unit is electrically connected to the power supply potential. The ground potential application unit is electrically connected to the ground terminal.

When a surge current of a high voltage is applied to a power supply pad or the like which serves as the power supply potential input unit, the potential of the drain of the field transistor rises to increase the depletion layer between the source and drain. As a result, the source and drain are electrically connected. Here, the surge current flows from the drain and through the source to a GND pad or the like which serves as the ground potential application unit. Therefore, the flow of the surge current towards the semiconductor circuit device can be prevented.

According to a fourth aspect of the present invention, an input protection circuit device is applied to a semiconductor circuit device that is connected to a power supply terminal and a ground terminal. The input protection circuit device includes a power supply potential input unit, a ground potential application unit, and a protection circuit unit. The protection circuit unit includes a first impurity region of a second conductivity type, and a pair of second impurity regions of a first conductivity type. The first impurity region of the second conductivity type is formed at a main surface of a semiconductor substrate of the first conductivity type. The pair of second impurity regions of the first conductivity type are formed within the first impurity region at the main surface sandwiching an isolation insulation film. The power supply potential input unit is electrically connected to one of the pair of second impurity regions. The ground potential application unit is electrically connected to the other of the pair second impurity regions. The protection circuit unit, the power supply potential input unit, and the ground potential application unit are arranged so as to be adjacent to each other.

When a surge current of high voltage is applied to a power supply pad and the like which becomes the power supply potential input unit, the potential of one of the pair of second impurity regions connected to this power supply pad, and corresponding to the drain of the field transistor of the third aspect rises. Therefore, a depletion layer between the one second impurity region corresponding to the source of the field transistor of the third aspect and the other of the pair of second impurity regions increases to result in electrical connection therebetween. Here, the surge current flows from one second impurity region through the other second impurity region towards a GND pad or the like which becomes the ground potential application unit. Therefore, flow of a surge current towards the semiconductor circuit device can be prevented. By conducting a surge current in advance within the first impurity region adjacent to the power supply pad or the GND pad, the surge current that may trigger a latch up of phenomenon in a circuit unit that includes an output transistor can be suppressed. Preferably, the protection circuit unit further includes a third impurity region of the first conductivity type isolated from the one second impurity region by an isolation oxide film. The third impurity region can be connected to the ground potential application unit. In this case, the conduction of the surge current from the power supply pad to the GND pad takes a path through the other second impurity region and the third impurity region. Therefore, the surge current can be conducted more efficiently. Preferably, the protection circuit unit further includes a fourth impurity region of the second conductivity type formed at the main surface, a fifth impurity region of the first conductivity type formed within the fourth impurity region at the main surface, and a sixth impurity region of the second conductivity type formed within the fourth impurity region so as to surround the fifth impurity region, and having an impurity concentration higher than that of the fourth impurity region. The power supply potential input unit can be electrically connected to the fifth impurity region. Also, the ground potential application unit can be electrically connected to the sixth impurity region. In this case, a current flow is conducted when greater than a predetermined voltage in a reverse direction to the diode formed in a forward direction from the fourth and sixth impurity regions of the second conductivity type to the fifth impurity region of the first conductivity type, so that a surge current can be conducted from the power supply pad to the GND pad. Furthermore, the surge current can be conducted efficiently since the sixth impurity region is formed so as to surround the fifth impurity region. The surge current flows in the vicinity of the power supply pad and the GND pad. Therefore, there is no influence on the semiconductor circuit device. More preferably, the protection circuit unit further includes a seventh impurity region of the second conductivity type formed at the main surface, and an eighth impurity region of the first conductivity type formed within the seventh impurity region at the main surface. The ground potential application unit and the eighth impurity region can be electrically connected. In such a case, a current greater than a constant voltage flows in a reverse direction to the diode formed in a forward direction from the seventh and eighth impurity regions of the second conductivity type towards the first conductivity type region of the semiconductor substrate. Therefore, a surge current can be conducted from the power supply pad to the GND pad. Since the surge current flows in the vicinity of the GND pad, there is no influence on the semiconductor circuit device.

According to a fifth aspect of the present invention, an input protection circuit device is applied to a semiconductor circuit device that is connected to a first power supply terminal and a second power supply terminal having a set voltage higher than the set voltage of the first power supply. The input protection circuit device includes a first power supply potential input unit, a second power supply potential input unit, and a protection circuit unit. The protection circuit unit includes a diode connected between the first power supply potential input unit and the second power supply potential input unit. The diode is connected in a forward direction from the second power supply potential input unit towards the first power supply potential input unit. The first power supply potential input unit is electrically connected to the first power supply terminal. The second power supply potential input terminal is electrically connected to the second power supply terminal.

According to the above structure, in a case where a current that is not generally generated when the second power supply potential is lower than the first power supply potential is generated due to the level of the second power supply potentials being reversed, a current of a forward direction is conducted to the diode forming a forward direction from the second power supply potential input unit to the first power supply potential input unit. By conducting a current to the diode in advance, generation of erroneous operation such as a latch up phenomenon or the like can be prevented in a circuit including an output transistor, for example, in a semiconductor circuit device.

According to a sixth aspect of the present invention, an input protection circuit device is applied to a semiconductor circuit device connected to a first power supply terminal and a second power supply terminal having a set voltage higher than the set voltage of the first power supply. The input protection circuit device includes a first power supply potential input unit, a second power supply potential input unit, and a protection circuit unit. The protection circuit unit includes a first impurity region of a second conductivity type, a second impurity region of a first conductivity type and a third impurity region of a second conductivity type. The first impurity region of the second conductivity type is formed at a main surface of a semiconductor substrate of the first conductivity type. The second impurity region of the first conductivity type is formed within the first impurity region at the main surface. The third impurity region of the second conductivity type is formed within the first impurity region at the main surface, and isolated from the second impurity region with an isolation insulation film. The third impurity region has an impurity concentration higher than that of the first impurity region. The first power supply potential input unit and the second impurity region are electrically connected. Also, the second power supply potential input unit and the third impurity region are electrically connected. Arrangement is established so that at least the protection circuit unit is adjacent to the second power supply potential input unit.

According to the above structure, in the case where a current not generated in a normal state when the second power supply potential is lower than the first power supply potential is generated due to the relationship of the two power supplies potentials being reversed, the current from the second power supply pad which becomes the second power supply potential input unit flows through the first and third impurity regions and the second impurity region corresponding to the diode of the fifth aspect into the first power supply pad which becomes the first power supply potential input unit. Therefore, the potential difference between the second power supply potential and the first power supply potential can be moderated. Furthermore, the current flows in the vicinity of at least the second power supply pad. Therefore, generation of an erroneous operation such as a latch up phenomenon can be prevented in a circuit including an output transistor, for example, of a semiconductor circuit device. Preferably, the protection circuit unit further includes a fourth impurity region of the first conductivity type formed to surround the first impurity region at a main surface, and having an impurity concentration higher than that of the semiconductor substrate of the first conductivity type, and a fifth impurity region of the second conductivity type formed so as to surround the fourth impurity region. The fourth impurity region and the first power supply potential input unit can be electrically connected. The fifth impurity region can be connected to the ground potential. In this case, a current also flows from the second power supply pad to the diode formed of the first and third impurity regions, and the first conductivity type region of the semiconductor substrate and the fourth impurity region. Therefore, the potential difference between the two power supplies can be moderated effectively. Such a flow of current is generated within the region surrounded by the fifth impurity region. Thus, generation of an erroneous operation of the semiconductor circuit device can be prevented more effectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

An input protection circuit device for protecting an internal device from a surge current applied to an input signal of a semiconductor device will be described hereinafter.

Figure 1:
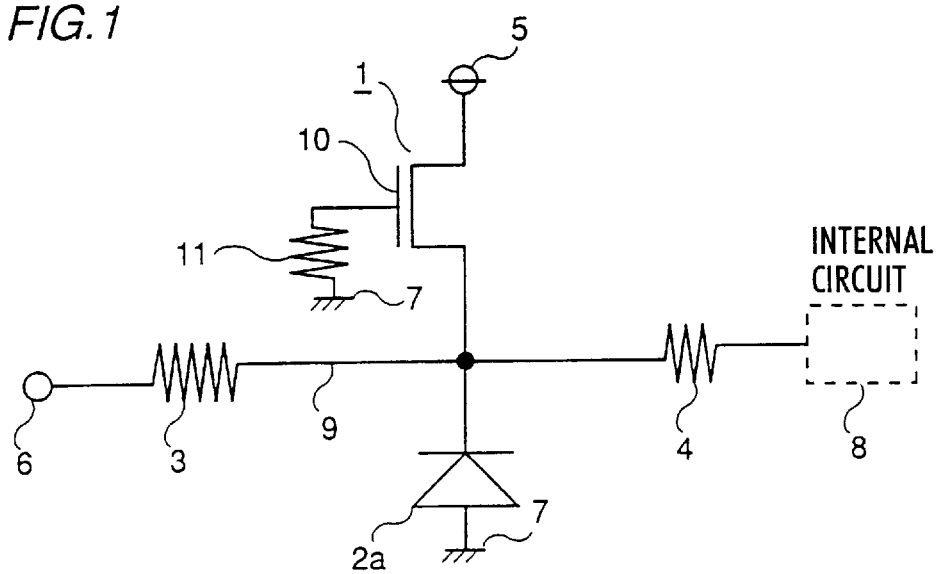
FIG. 1 shows an input protection circuit device according to a first embodiment of the present invention.

Referring to FIG. 1, an input protection circuit device of the first embodiment includes resistors A3 and B4 connected in series at an input signal line 9 connecting an input pad 6 and an internal circuit 8, and an nMOS transistor 1 between input signal line 9 of a portion between resistors A 3 and B 4 and a first power supply (Vcc) 5. nMOS transistor 1 has its source connected to input signal line 9 and its drain connected to first power supply (Vcc) 5. The input protection circuit device further includes a diode 2a between input signal line 9 and GND 7. Diode 2a is connected in a forward direction from GND 7 towards input signal line 9. nMOS transistor 1 has a gate electrode 1 connected to GND 7 via a resistor-C 11.

Figure 2:
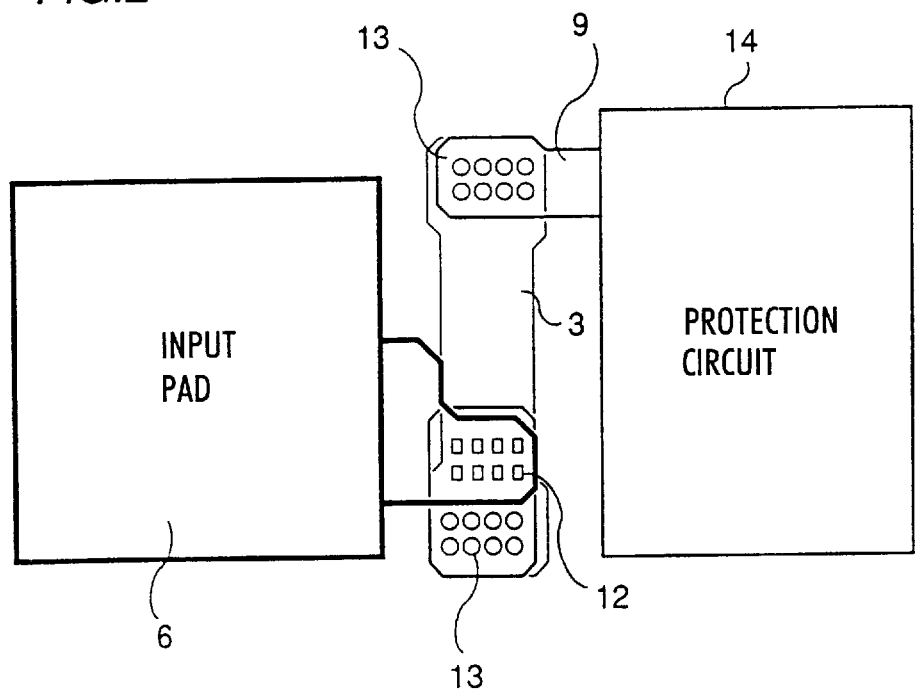
FIG. 2 is a serial plane layout of an input protection circuit device according to the first embodiment of the present invention.

Referring to FIG. 2, a signal applied to input pad 6 formed of an aluminum interconnection passes through resistor-A 3 via a through hole 12 and a contact 13 to be applied to input signal line 9 formed of an aluminum interconnection via contact 13. Then, the signal is delivered to protection circuit unit 14. Protection circuit unit 14 has the plane layout shown in FIG. 13.

Figure 3:
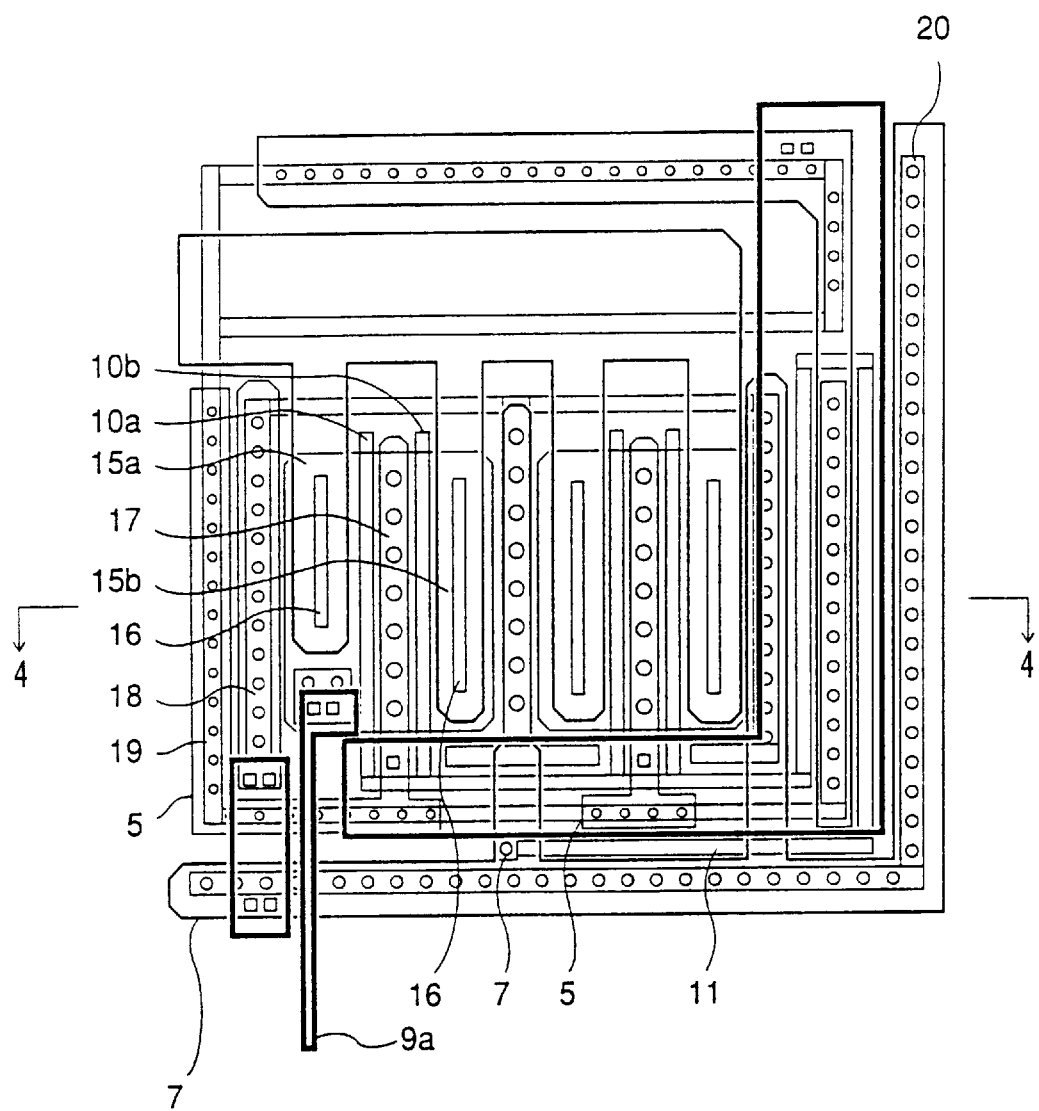
FIG. 3 is a plane layout of a protection circuit unit of the input protection circuit device according to the first embodiment of the present invention.

Referring to FIG. 3, a drain region 17 is disposed at a region sandwiched by respective one sides of two gate electrodes 10a and 10b. Source regions 15a and 15b are disposed at respective other sides of gate electrodes 10a and 10b, respectively. The two MOS transistors share the drain region. First power supply (Vcc) 5 is connected to drain region 17. Input signal line 9 is connected to source regions 15a and 15b via a contact 16. Input signal line 9a routed to the internal circuit is connected to source region 15a. Gate electrodes 10a and 10b are connected to GND 7 via a resistor-C 11 formed of polysilicon of the like. A $p^+$ diffusion layer 18 connected to GND 7 is disposed so as to surround the MOS transistor. An $n^+$ diffusion layer 19 connected to first power supply (Vcc) 5 is disposed so as to surround $p^+$ diffusion layer 18. Furthermore, a $p^+$ diffusion layer 20 connected to GND 7 is disposed so as to surround $p^+$ diffusion layer 18 bidirectionally.

Figure 4:
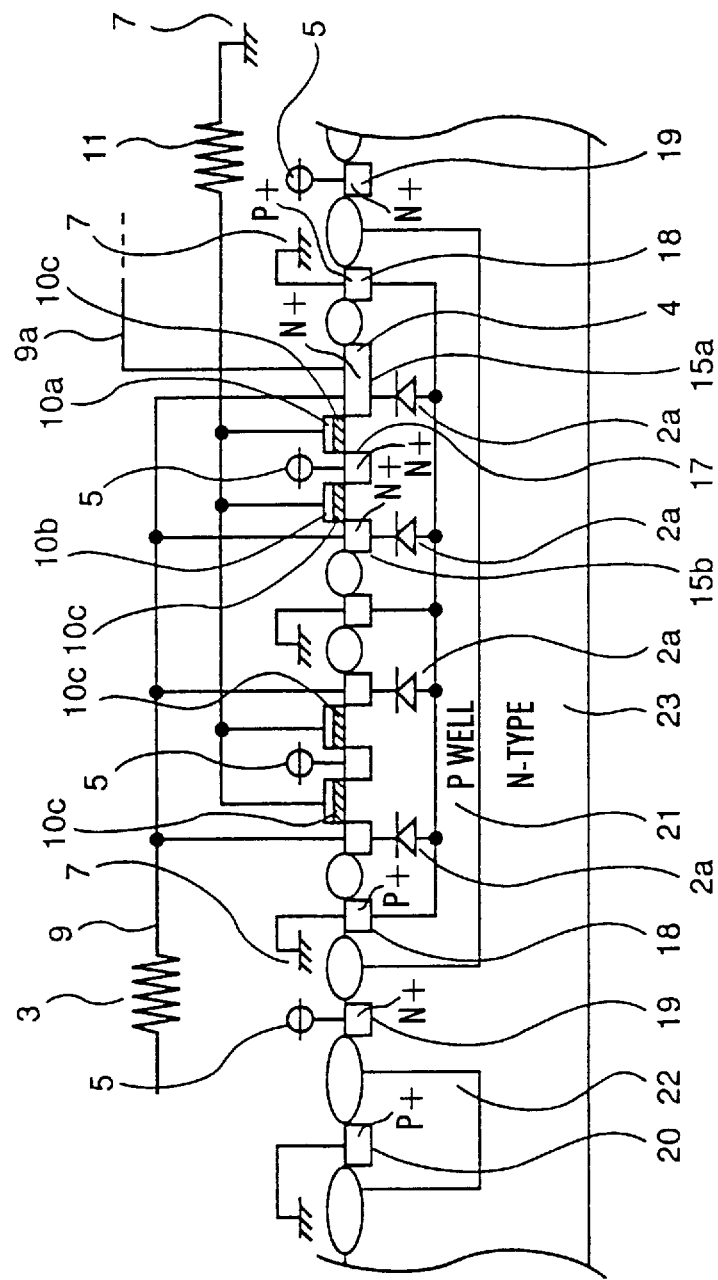
FIG. 4 is a schematic diagram showing a sectional view taken along the line 4—4 of FIG. 3 and an equivalent circuit.

Referring to FIG. 4, the MOS transistor including source regions 15a and 15b, drain region 17, and gate electrodes 10a and 10b described in FIG. 3 and p+ diffusion layer 18 are formed within the region of a first P well 21 formed in an n type substrate 23. A parasitic diode is formed of first P well 21 and n type source regions 15a and 15b of the MOS transistor. This corresponds to diode 2a of FIG. 1. N+ diffusion layer 19 connected to first power supply (Vcc) 5 is formed so as to surround first P well 21. A second P well 22 is located at the outer side thereof. A p+ diffusion layer 20 is formed within the region thereof. This structure corresponds to four of MOS transistor 1 and diode 2a of the input protection circuit device of FIG. 1 connected in parallel between the first power supply (Vcc) and GND.

The operation of this input protection circuit device will be described hereinafter with reference to FIG. 4. When a surge current of a potential lower than that of GND is applied by an input pad, the parasitic n-p-n transistor formed of n type substrate 23, first P well 21 and n type source region 15a connected to input signal line 9 is turned on. Here, current flows from n+ diffusion layer 19 connected to first power supply (Vcc) 5 through n type substrate 23 and diode 2a formed of first P well 21 and n+ diffusion layer 19 to moderate the surge current. This current conduction is effected only in the vicinity of first P well 21 surrounded by n+ diffusion layer 19. Although it is generally assumed that such a current will be conducted from an indefinite portion other than the input protection circuit device when the potential of semiconductor substrate 23 is the first power supply (Vcc), erroneous operation such as a latch up phenomenon in the internal circuit device can be prevented by conducting a current in the vicinity of the input protection circuit device. Furthermore, a larger area of n+ diffusion layers 15a and 15b corresponding to source regions can be ensured by sharing n+ diffusion layer 17 corresponding to the drain region in the two MOS transistors. Thus, the greater amount of current can be conducted by diode 2a formed of n+ diffusion layers 15a and 15b.

When a surge current of a potential higher than the potential of the first power supply (Vcc) is supplied to the input pad, the potential of n+ diffusion layer 15a corresponding to the source region of the MOS transistor connected to input signal line 9 rises. The potential of gate electrode 10a rises due to the coupling capacitance which is the parasitic capacitance of gate electrode 10a and n+ diffusion layer 15a, whereby the MOS transistor is turned on. Therefore, a surge current flows from n+ diffusion layer 15a towards n+ diffusion layer 17 corresponding to the drain region. Gate electrode 10a is connected to GND 7 via resistor-C 11, so that gate electrode 10a is recovered to the potential of GND 7 after the surge current passes through. The time to return to its former potential level is defined as a time constant. The time constant is preferably as long as possible from the standpoint of facilitating passage of a surge current since a longer ON period for the MOS transistor is desirable. In contrast, the time constant should be as short as possible from the standpoint of circuitry operation.

Using specific values for the time constant, the value of resistance R of resistor C is estimated. Coupling capacitance C is represented as:

$$C = \epsilon \times L \times W/Tox, \quad \epsilon = 3.9 \times 8.85 \times 10^{-12} F/m$$

where L is the gate length, W the gate width, and Tox the film thickness of a gate oxide 10c. For example, assuming that:

$L = 1.0 \times 10^{-6}$ m,
$w = 400 \times 10^{-6}$ m,
$Tox = 100 \times 10^{-6}$ m,
then C=1.38 pF is obtained.
Here, the time constant is represented as:

$$C(pF) \times R(k\Omega) = \text{time constant } (ns)$$

Assuming that the value of the time constant is 10 ns taking into consideration the cycle time of the semiconductor device, the resistance R of resistor C is:
$R = 7.25$ kω

Assuming that the third resistor is formed of polysilicon, the length of the third resistor is 242 μm with 30 ω as the sheet resistance of the polysilicon and a width of 1 μm. In the present embodiment, the length of resistor-C 11 is set to 300 μm.

The invention is not limited to the present embodiment, and can be applied to any semiconductor device that includes a signal input terminal, a ground terminal, and a power supply terminal, and to which a surge current may be applied to the signal input terminal.

Embodiment 2

Figure 5:
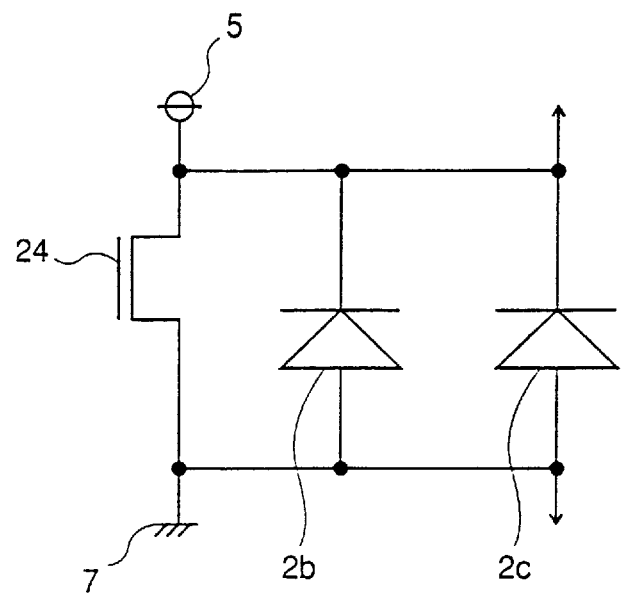
FIG. 5 shows an input protection circuit device according to a second embodiment of the present invention.

An input protection circuit device for protecting an internal device from a surge current applied to the power supply of a semiconductor device will be described hereinafter with reference to FIG. 5.

The input protection circuit device includes a field transistor 24, and diodes 2b and 2c connected in parallel. Field transistor 24 has its drain connected to first power supply (Vcc) 5, and its source connected to GND 7. Diodes 2b and 2c are connected in a forward direction from GND 7 towards first power supply (Vcc) 5.

Figure 6:
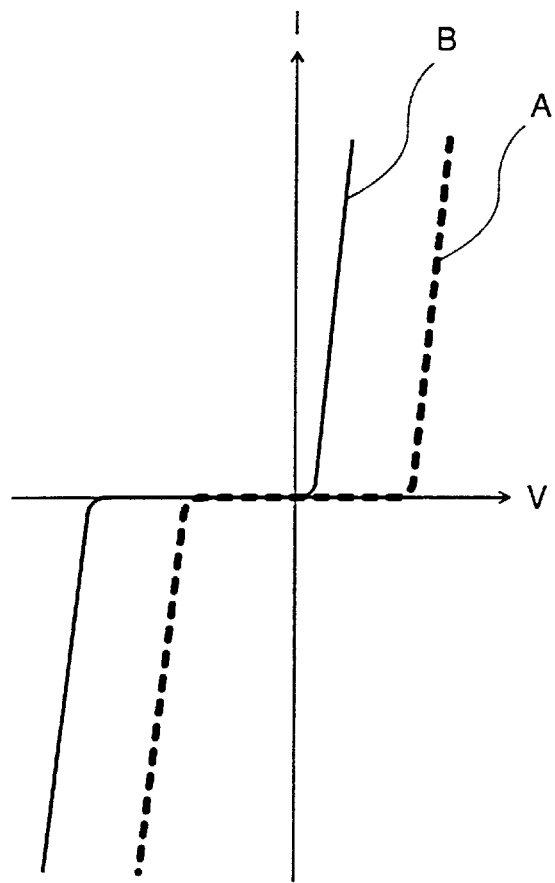
FIG. 6 is a diagram for describing an operation of the input protection circuit device of the second embodiment.

When a surge current of a voltage extremely higher than the voltage of first power supply (Vcc) 5 is applied thereto, the drain potential of field transistor 24 rises. Here, the spread of the depletion layer between the source-drain region and the semiconductor substrate causes the depletion layer in the vicinity of the source region to be connected to the depletion layer in the vicinity of the drain to result in a current flow between the source and drain. As a result, the surge current is connected to ground to protect the internal device from the surge current. Since diodes 2b and 2c are connected in a reverse direction from first power supply (Vcc) 5 towards GND 7, a current is conducted when greater than a predetermined voltage. The relationship between this voltage and current is shown in FIG. 6. FIG. 6 represents the dependency of the current flowing across GND-first power supply (Vcc) on the voltage across GND-first power supply (Vcc). A indicates the case of only a field transistor, and B of only a diode. According to this relationship, the field transistor can conduct a surge current at a voltage lower than that of the diode. This means that the protection function of a field transistor for the internal device is higher than that of the diode when a surge of high voltage is applied. Although the circuit of FIG. 5 has a structure in which field transistor 24 and diodes 2b and 2c are respectively connected in parallel, the input protection function is available even with only field transistor 24. By providing diodes 2b and 2c as shown in FIG. 5, the input protection function can be achieved even if field transistor 24 is damaged.

Figure 7:
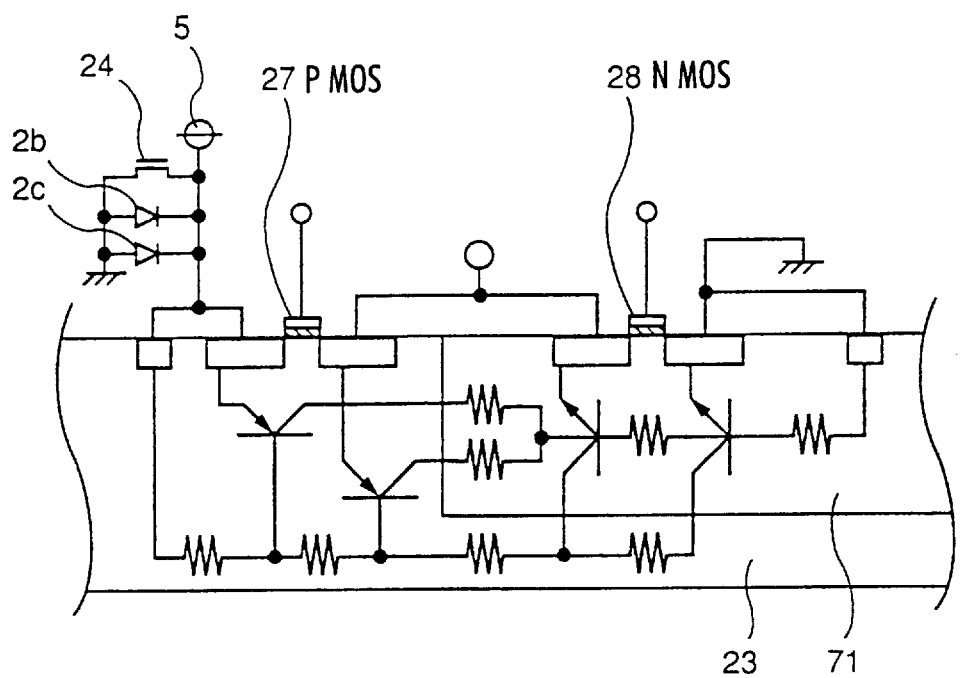
FIG. 7 shows an application of the input protection circuit device of the second embodiment.

An application of this input protection circuit device is shown in FIG. 7. Referring to FIG. 7, an input protection circuit device is provided between first power supply (Vcc)

5 and GND 7 of a semiconductor device including a pMOS transistor 27 and an nMOS transistor 28.

According to this structure, a surge current of even a small level flowing from first power supply (Vcc) 5 towards GND 7 which becomes the cause of the latch up as described in the section of the prior art can be eliminated.

An example of a serial plane layout of the input protection circuit device will be described with reference to FIG. 8. A protection circuit unit-A 31 including a field transistor is disposed between a first power supply (Vcc) pad 29 to which the first power supply (Vcc) is applied and a GND pad 30 connected to GND. FIG. 9 is a plan view of the structure of protection circuit unit-A 31. Referring to FIG. 9, first power supply (Vcc) pad 29 and $n^+$ diffusion layer 34 are connected by an aluminum interconnection 32, a through hole 12 and an aluminum interconnection 33. GND pad 30 and $n^+$ diffusion layer 35 are connected by an aluminum interconnection 36, a through hole 12 and an aluminum interconnection 37. $N^+$ diffusion 5 layer 34 and $n^+$ diffusion layer 35 are disposed alternately and isolated by a field oxide film 35. A $p^+$ diffusion layer 39 is arranged so as to surround $n^+$ diffusion layers 34 and 35. $P^+$ diffusion layer 39 is connected to GND via a contact 13, an aluminum interconnection 37, a through hole 12 and an aluminum interconnection 36. $N^+$ diffusion layers 34 and 35 and $n^+$ diffusion layer 39 are formed within the region of P well 40.

Figure 10:
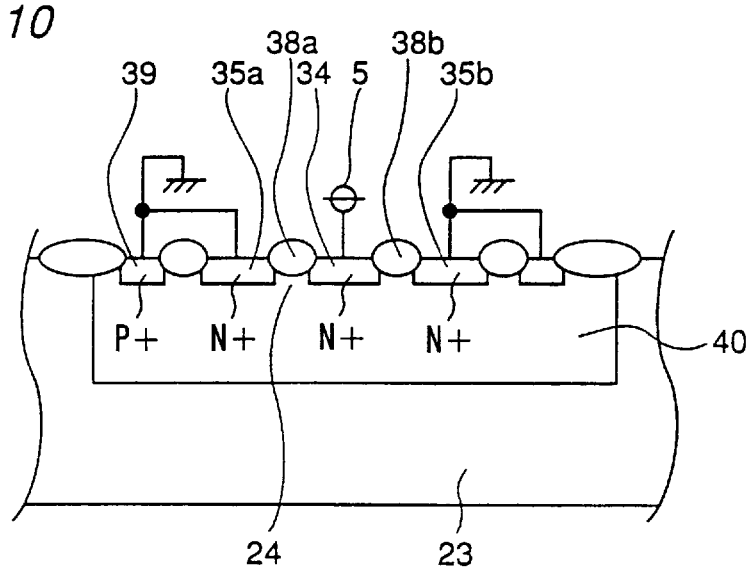
FIG. 10 is a schematic diagram showing a sectional view taken along line 10—10 of FIG. 9 and an equivalent circuit.

In FIG. 10, the arrangement of $n^+$ diffusion layer 34 and $n^+$ diffusion layers 35a and 35b are partially omitted for the sake of simplification. Referring to FIG. 10, first power supply (Vcc) 5 is connected to $n^+$ diffusion layer 34 corresponding to the drain of the field transistor, and $n^+$ diffusion layers 35a and 35b corresponding to the sources thereof are connected to GND. $N^+$ diffusion layer 34 is isolated from $n^+$ diffusion layer 35a or $n^+$ diffusion 35b by field oxide films 38a, 38b. $P^+$ diffusion layer 39 is provided so as to surround field transistor 24. By arranging $n^+$ diffusion layer 34 connected to first power supply (Vcc) 5 and $n^+$ diffusion layers 35a and 35b connected to GND in an alternate manner, the surge when applied to the first power supply (Vcc) can be conducted to two $n^+$ diffusion layers 35a and 35b located at both sides of $n^+$ diffusion layer 34. As a result, the effect of protecting a device in the internal circuit from the surge current is further improved.

Another example of the plane layout of an input protection circuit device will be described with reference to FIG. 11.

A protection circuit unit-B 46 is disposed adjacent to a first power supply (Vcc) pad 29. In protection circuit unit-B 46, first power supply (Vcc) pad 29 to which the first power supply (Vcc) is applied is connected with $n^+$ diffusion layer 41 via aluminum interconnection 32, through hole 12, aluminum interconnection 33, and contact 13. $P^+$ diffusion layer 42 is arranged so as to surround $n^+$ diffusion layer 41 from three directions. $P^+$ diffusion layer 42 is connected to GND via contact 13 and aluminum interconnection 37. $N^+$ diffusion layer 41 and $p^+$ diffusion layer 42 are formed within the region of P well 43.

Figure 12:
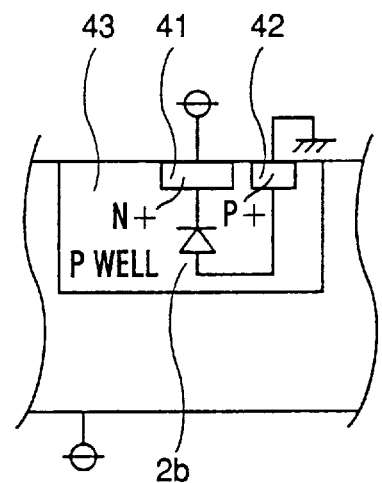
FIG. 12 is a schematic diagram showing a sectional view taken along line 12—12 of FIG. 11 and an equivalent circuit.

Referring to FIG. 12, diode 2b is formed of a P well 43 and an $n^+$ diffusion layer 41. According to this structure, diode 2b is located in the vicinity of first power supply (Vcc) pad 29, and $p^+$ diffusion layer 42 surrounds $n^+$ diffusion layer 41 from three directions excluding the side facing first power supply (Vcc) pad 29. Therefore, the effect of removing the surge current is increased to protect the device in the internal circuit from the surge current.

Figure 13:
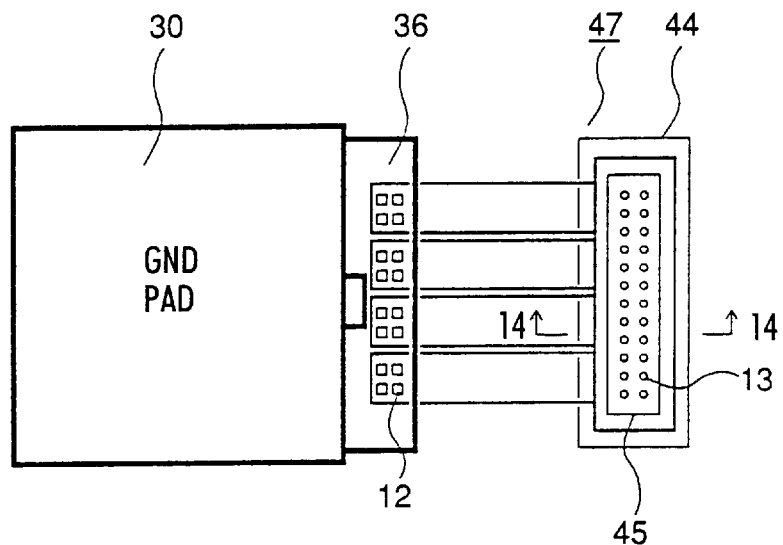
FIG. 13 is a further plane layout of a protection circuit unit of the input protection circuit device according to the second embodiment.

A further example of a plane layout of an input protection circuit device is shown in FIG. 13. A protection circuit unit-C 47 is provided adjacent to GND pad 30. In protection circuit unit-C 47, GND pad 30 is connected to $p^+$ diffusion layer 45 via aluminum interconnection 36, through hole 12, aluminum interconnection 37 and contact 13. $P^+$ diffusion layer 45 is formed within the region of P well 44.

Figure 14:
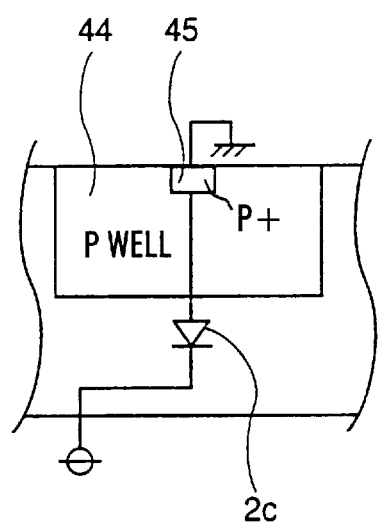
FIG. 14 is a schematic diagram showing a sectional view taken along line 14—14 of FIG. 13 and an equivalent circuit.

Referring to FIG. 14, diode 2c is formed of P well 44 and n type substrate 23. According to the structure, the effect of removing the surge is increased since diode 2c is located in the vicinity of GND pad 30. Therefore, the device in the internal circuit can be protected from the surge current.

Figure 8:
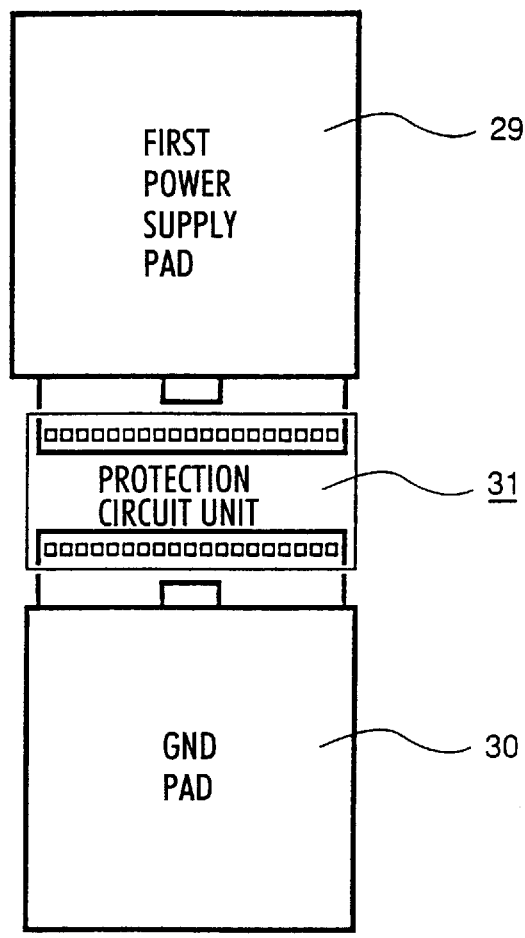
FIG. 8 shows a serial plane layout of the input protection circuit device according to the second embodiment of the present invention.
Figure 9:
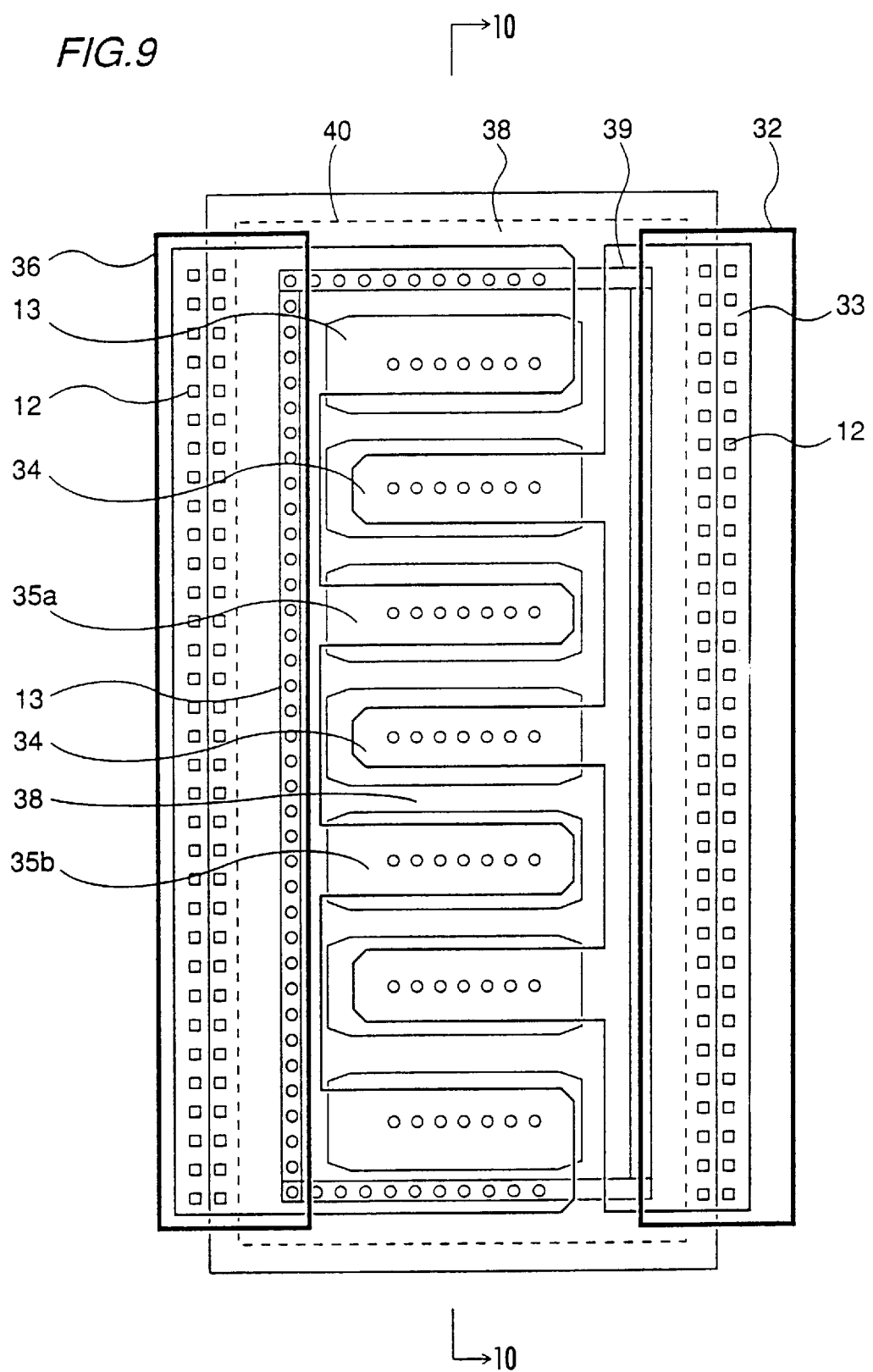
FIG. 9 is a plane layout of the protection circuit unit of the input protection circuit device according to the second embodiment.
Figure 11:
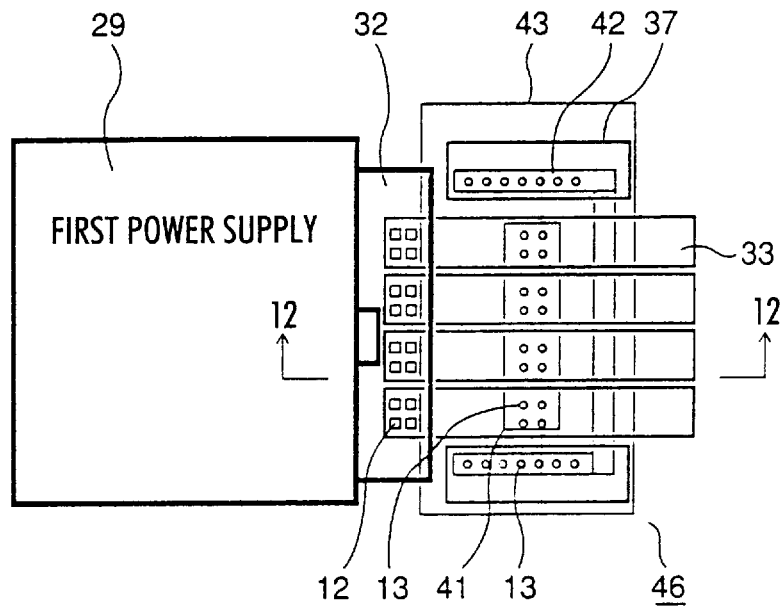
FIG. 11 shows another plane layout of the protection circuit unit of input protection circuit device of the second embodiment.
Figure 15:
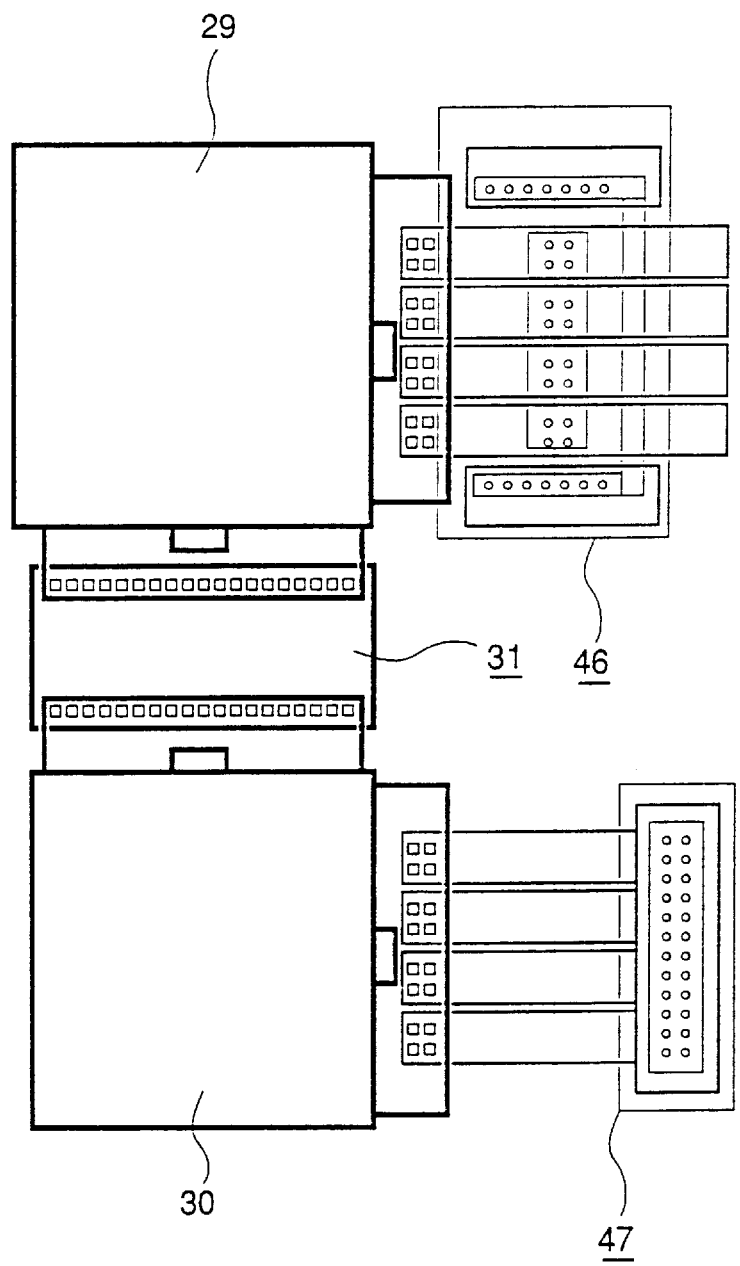
FIG. 15 is still another plane layout of the input protection circuit device of the second embodiment.

FIG. 15 shows a plane layout which is a combination of the structure shown in FIGS. 8, 11 and 13. According to this arrangement, first power supply (Vcc) pad 29 and GND pad 30 are located adjacent to each other, and a protection circuit unit-A 31 including a field transistor, a protection circuit unit-B 46 including a diode, and protection circuit unit-C 47 are located in the vicinity thereof. Since the distance between each pad and each protection circuit unit can be minimized, the electrical resistance therebetween can also be set as low as possible. Thus, the surge can be eliminated more effectively to prevent a latch up phenomenon in an output transistor which is triggered by a surge current. The invention is not limited to the present embodiment, and can be applied to any semiconductor device that includes a power supply terminal and a ground terminal, and to which a surge current may be applied to the power supply.

Embodiment 3

An input protection circuit device applied to a device including two types of power supplies of different potentials will be described hereinafter with an SRAM as an example.

Figure 16:
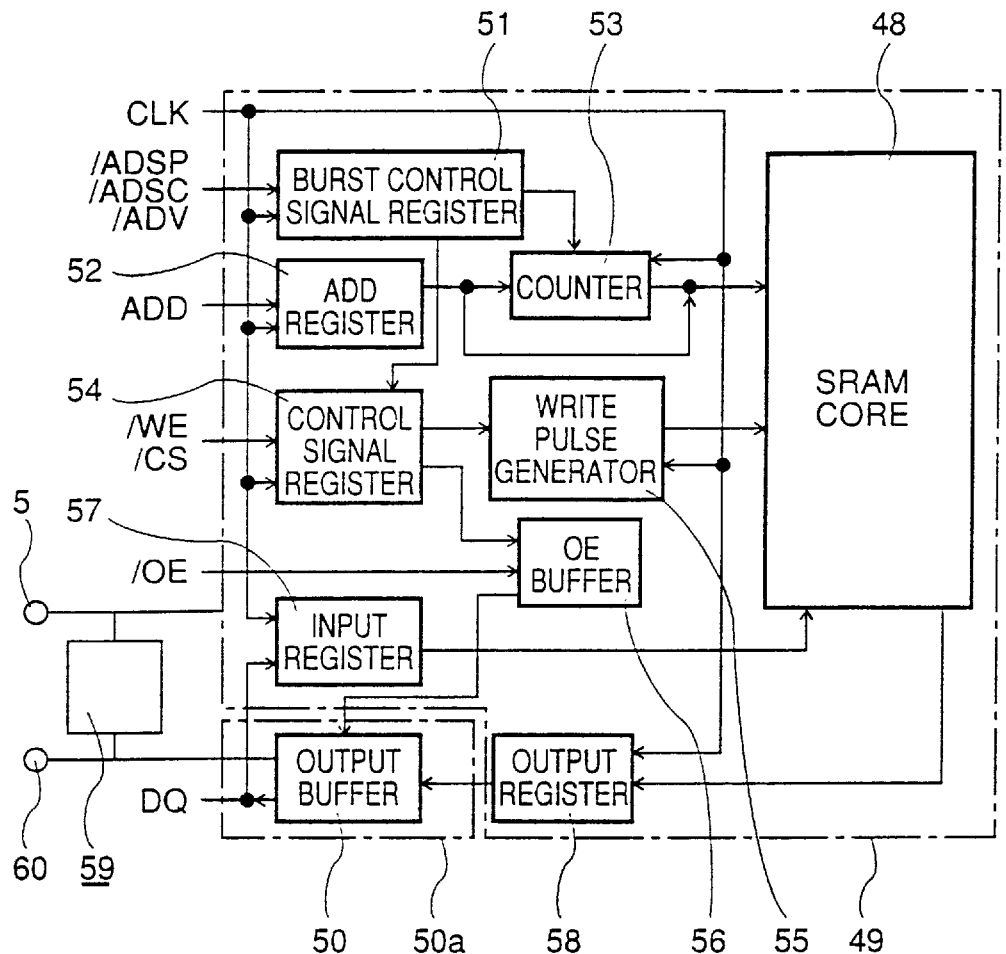
FIG. 16 is a block diagram of an input protection circuit device and an SRAM according to a third embodiment of the present invention.

Referring to FIG. 16, the SRAM includes an internal circuit unit 49 and an external circuit unit 50a. Internal circuit unit 49 includes an SRAM core 48, a burst control signal register 51, an ADD register 52, a counter 53, a write pulse generator 55, a control signal register 54, an OE buffer 56, and an input register 57. External circuit unit 50a includes an output buffer unit 50. A first power supply (Vcc) 5 is connected to internal circuit unit 49. A second power supply (Vccq) 60 is connected to external circuit unit 50a. In a normal state, the potential of the first power supply (Vcc) is higher than the potential of the second power supply (Vccq). In the present embodiment, the first and second power supplies are 3.3 V and 2.5 V, respectively. The SRAM includes a protection circuit unit-D 59 connected to first power supply (Vcc) 5 and second power supply (Vccq) 60.

Figure 17:
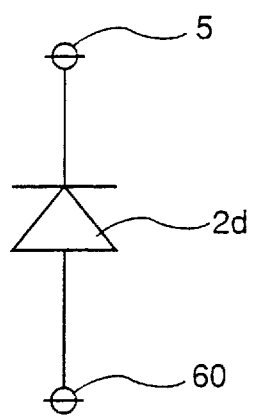
FIG. 17 shows an input protection circuit device according to the third embodiment of the present invention.

Protection circuit unit-D 59 includes a diode 2d in a forward direction from second power supply (Vccq) 60 towards first power supply (Vcc) 5 between first power supply (Vcc) 5 and second power supply (Vccq) 60 shown in FIG. 17. Protection circuit unit-D is formed adjacent to the second power supply (Vccq) pad as an input protection circuit device.

Figure 18:
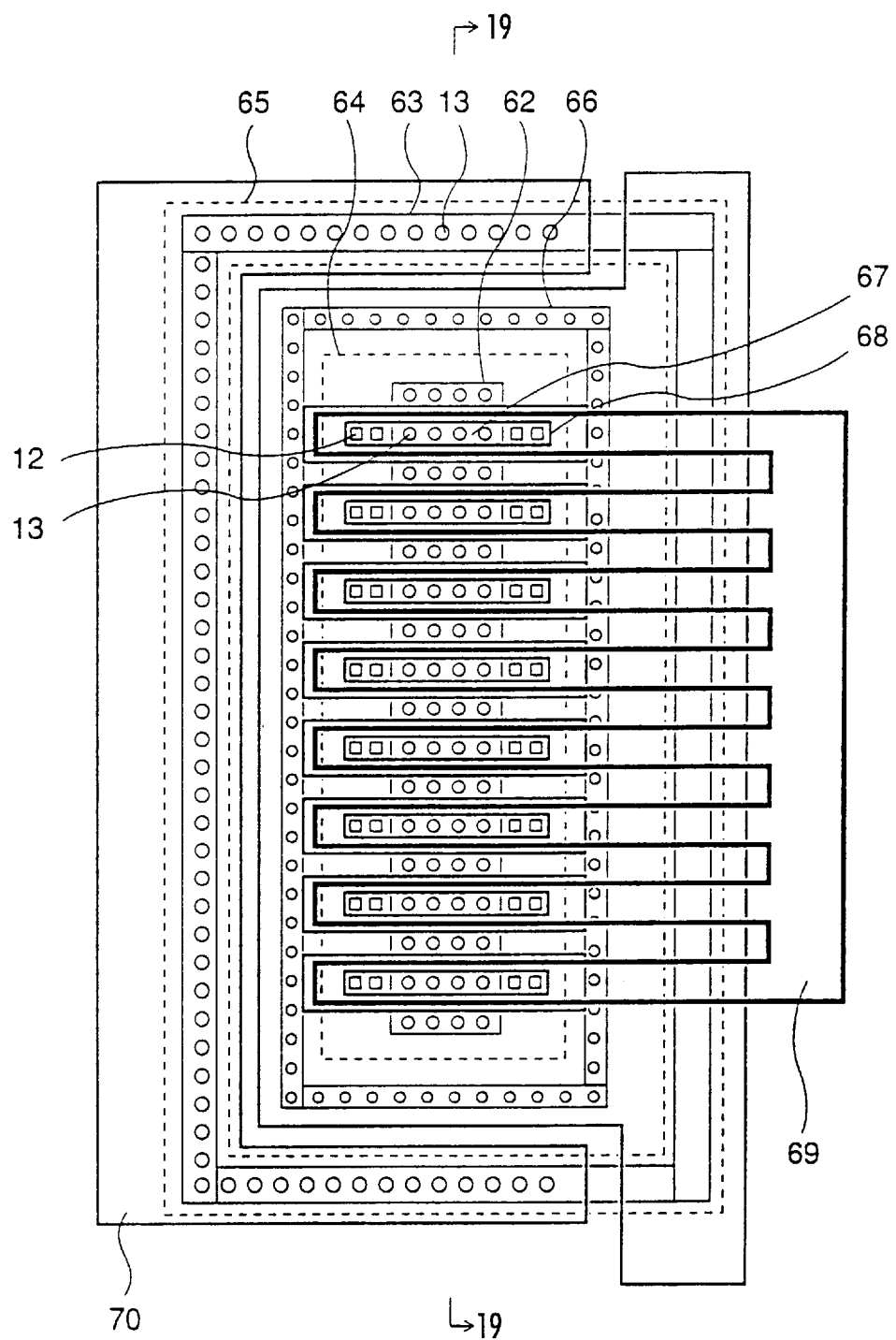
FIG. 18 shows a serial plane layout of the input protection circuit device according to the third embodiment.

An example of the plane layout of protection circuit unit-D 59 will be described with reference to FIG. 18. An $n^+$ diffusion layer 62 and an $n^+$ diffusion layer 66 are connected to first power supply (Vcc) 5 via contact 13 and aluminum interconnection 61. A $p^+$ diffusion layer 67 is connected to second power supply (Vccq) 60 via contact 13, aluminum interconnection 68, through hole 12, and aluminum interconnection 69. $N^+$ diffusion layer 62 and $p^+$ diffusion layer 67 are formed within the region of P well 64. $N^+$ diffusion layer 66 is formed so as to surround P well 64. A trench-like P well 65 is formed so as to surround $n^+$ diffusion layer 66. A $p^+$ diffusion layer 63 is formed within the region of P well 65. $P^+$ diffusion layer 63 is connected to GND via contact 13 and aluminum interconnection 70.

Figure 19:
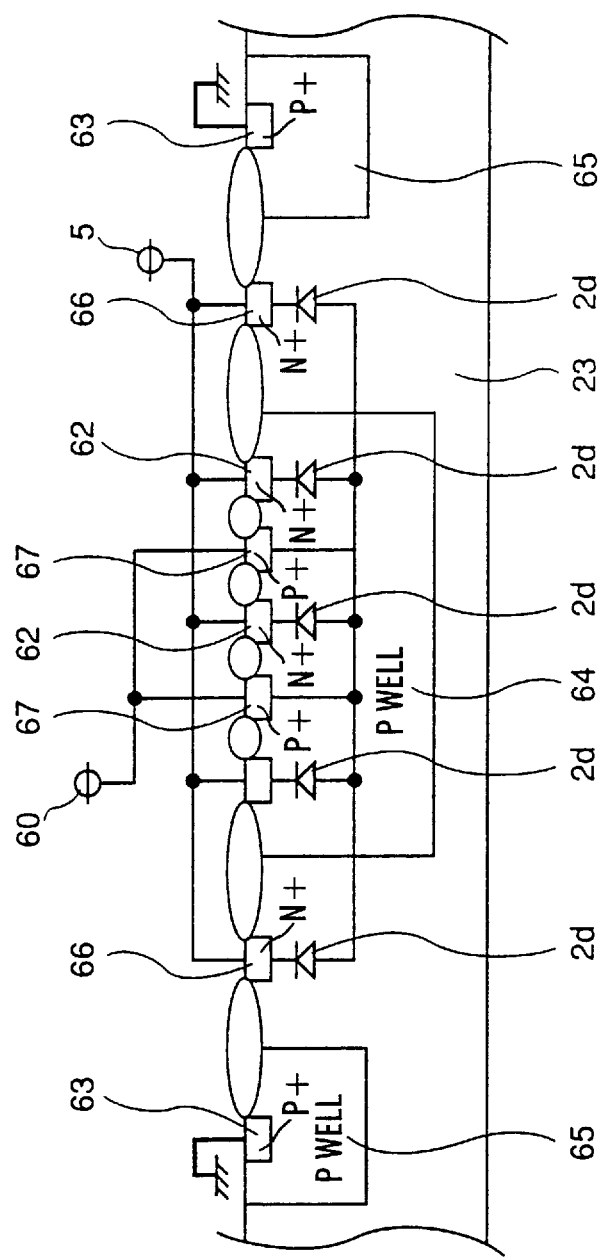
FIG. 19 is a schematic diagram showing a sectional view taken along line 19—19 of FIG. 18 and an equivalent circuit.
Figure 20:
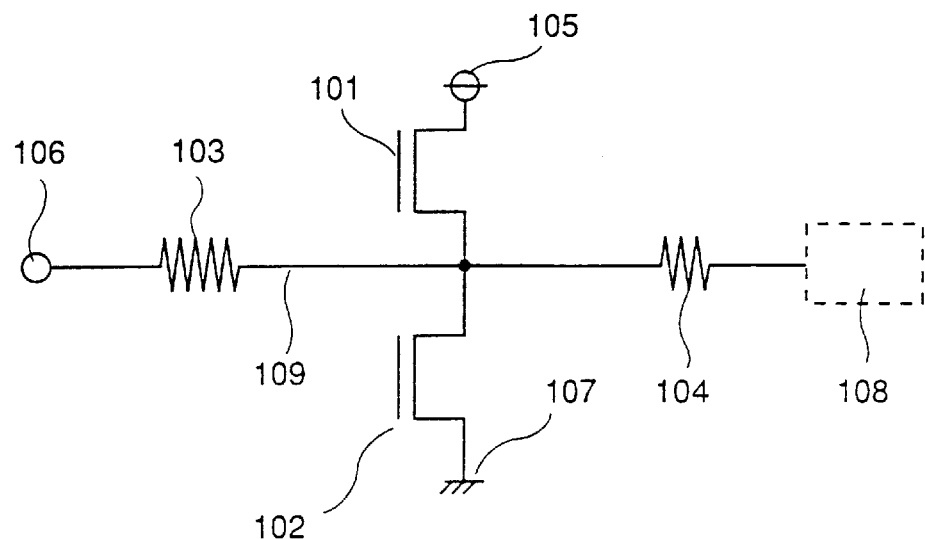
FIG. 20 shows an example of a conventional input protection circuit device.
Figure 21:
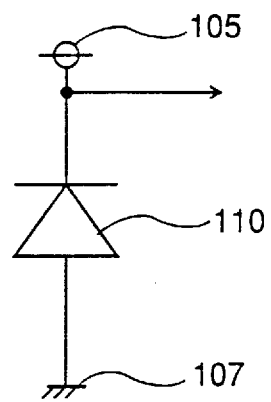
FIG. 21 shows an example of another conventional input protection circuit device.
Figure 22:
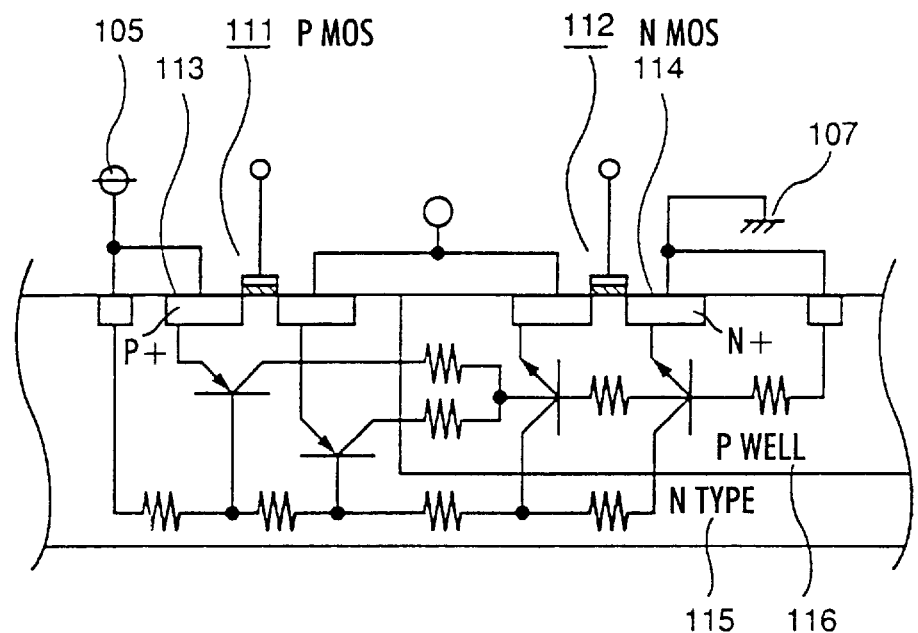
FIG. 22 is a schematic diagram showing a sectional view and an equivalent circuit for describing the problems of a semiconductor device according to prior art.
Figure 23:
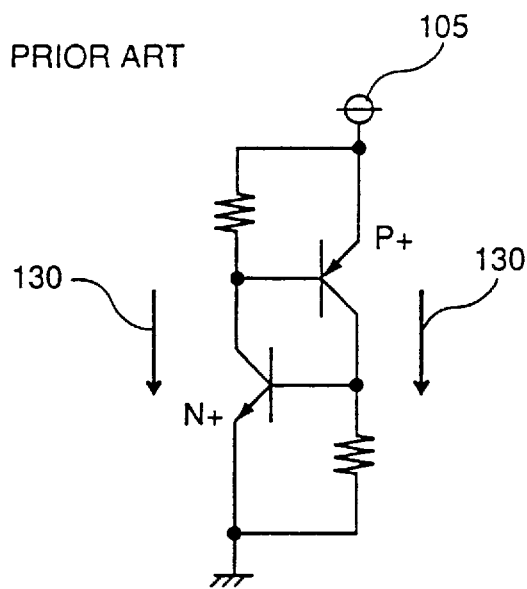
FIG. 23 is a diagram showing an equivalent circuit for describing the problems of a semiconductor device according to prior art.
Figure 24:
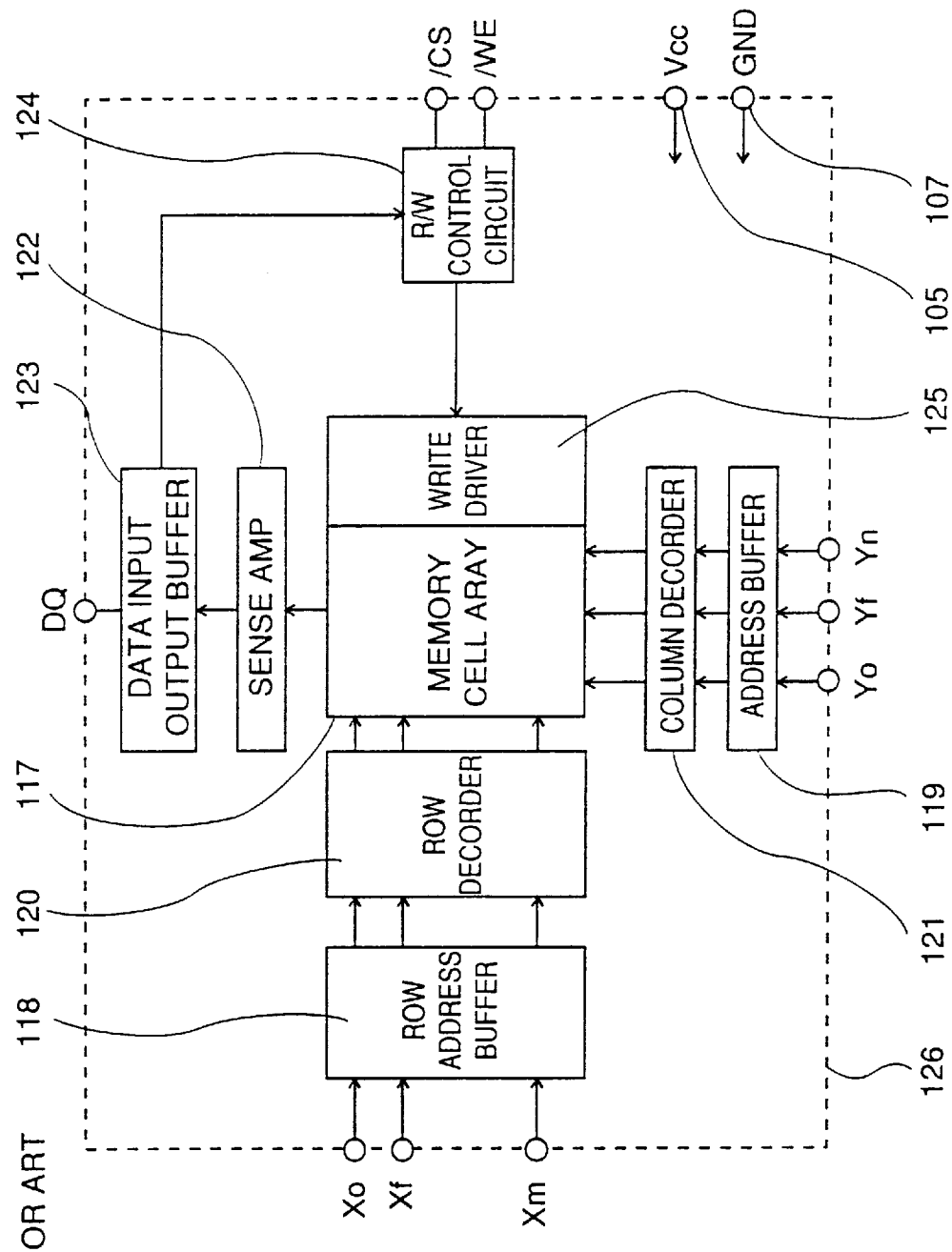
FIG. 24 is a block diagram showing a structure of an SRAM according to prior art.

Referring to FIG. 19, a diode 2*d* is formed of P well 64 and n⁺ diffusion layer 62 or of P well 64 and n⁺ diffusion layer 66. For the sake of simplification, illustration of the arrangement of n⁺ diffusion layer 62 and p⁺ diffusion layer 67 is partially omitted.

When the normal relationship of the potentials of the first and second power supplies is reversed in turning on the first power supply (Vcc) 5 and the second power supply (Vccq) 60, i.e. when the voltage of the second power supply (Vccq) becomes higher than the voltage of the first power supply (Vcc) in transition, the current flows from p⁺ diffusion layer 67 towards n⁺ diffusion layer 62 via P well 64, or towards n⁺ diffusion layer 66 via n type substrate 23.

Figure 25:
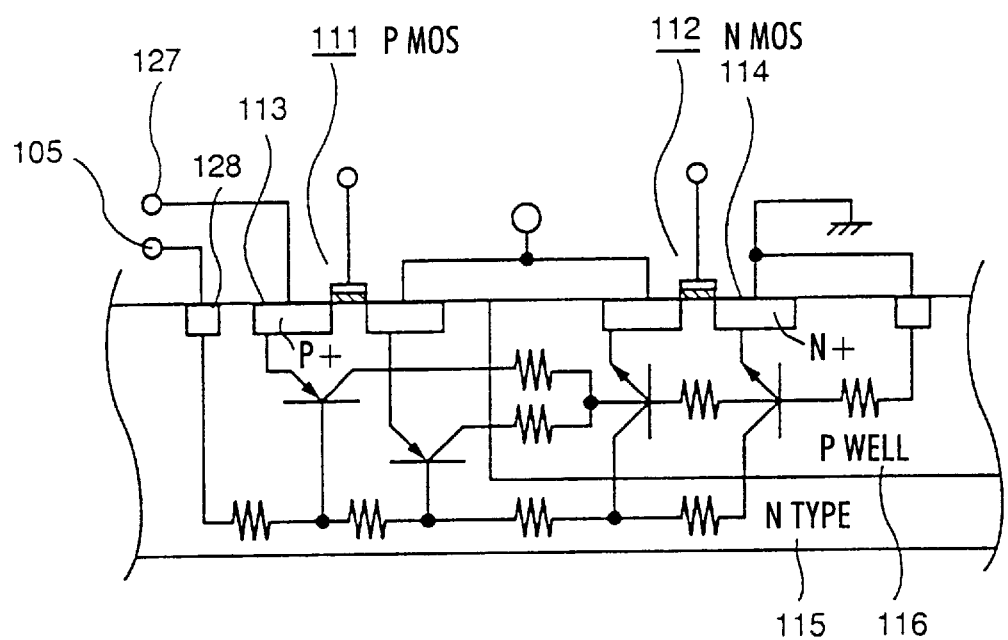
FIG. 25 shows a sectional view and an equivalent circuit for describing the problems of an SRAM according to prior art.

Since the protection circuit unit-D is formed adjacent to the second power supply (Vccq) pad (not shown), this transitional current is conducted only in the vicinity of the second power supply (Vccq) pad. Therefore, as described in the section of the prior art with reference to FIG. 25, generation of a great potential difference between the second power supply (Vccq) connected to the source of the output transistor and the first power supply (Vcc) connected to the substrate can be prevented. Thus, a latch up phenomenon in the output transistor can be suppressed.

In the SRAM of the present embodiment, the first power supply (Vcc) for the input circuit to reduce noise is set to 3.3 V, and the second power supply (Vccq) for the output transistor is set to 2.5 V. In a semiconductor device including an SRAM and a Central Processing Unit (referred to as CPU hereinafter), there may be difference in the power supply voltage between the SRAM and the CPU connected to the SRAM. For example, when the power supply voltage of the SRAM is 5 V and the power supply voltage of the CPU is 3.3 V, the output voltage of the SRAM must be set to 3.3 V to match the voltage of the CPU. More specifically, the first power supply (Vcc) is set to 5 V and the second power supply (Vccq) is set to 3.3 V in the SRAM. In this case, a latch up phenomenon in the output transistor can be suppressed by using the input protection circuit device.

The present invention is not limited to an SRAM, and the present input protection circuit device can be applied to any semiconductor device having two types of power supplies of different potentials to prevent erroneous operation of the semiconductor device caused by reverse of the relationship of the potential.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input protection circuit device applied to a semiconductor circuit device connected to a power supply terminal, a ground terminal, and a signal input terminal, said input protection circuit device comprising a protection circuit unit and a signal input unit, wherein said protection circuit unit comprises
    a signal transmission path portion electrically connecting said signal input unit and said semiconductor circuit device,
    a transistor connected between said signal transmission path portion and said power supply terminal, and
    a diode connected between said signal transmission path portion and said ground terminal,
    wherein
      said transistor has its source connected to said signal transmission path portion, its drain connected to said power supply terminal, and a gate electrode connected to said ground terminal via a first resistor,
    said diode is connected in a forward direction from said ground terminal towards said signal transmission path portion, and
    said signal input unit is electrically connected to said signal input terminal.

2. The input protection circuit device according to claim 1, wherein a product between a value of a parasitic capacitance between said gate electrode and said source and a resistance of said first resistor is a value smaller than a cycle time of said semiconductor circuit device.

3. An input protection circuit device applied to a semiconductor circuit device connected to a power supply terminal, a ground terminal, and a signal input terminal, said input protection circuit device comprising a protection circuit unit and a signal input unit, wherein said protection circuit unit comprises
    a first impurity region of a second conductivity type formed at a main surface of a semiconductor substrate of a first conductivity type,
    a pair of second impurity regions of the first conductivity type formed at said main surface and spaced apart within said first impurity region,
    a first gate electrode formed on said main surface sandwiched by said pair of second impurity regions with an insulation film thereunder,
    a third impurity region of the first conductivity type formed at said main surface so as to surround said first impurity region, and having an impurity concentration higher than that of said semiconductor substrate of the first conductivity type,
  wherein
    said signal input unit is electrically connected to said signal input terminal,
    said signal input terminal is electrically connected to one of said pair of second impurity regions,
    said one second impurity region is electrically connected to said semiconductor circuit device via a second resistor,
    said power supply terminal is electrically connected to the other of said pair of second impurity regions and also to said third impurity region,
    said ground terminal is electrically connected to said first impurity region, and also to said first gate electrode by a said first resistor, and
    said protection circuit unit is arranged adjacent to said signal input unit.

4. The input protection circuit device according to claim 3, wherein a product of a parasitic capacitance of said insulation film sandwiched between said first gate electrode and said main surface and a resistance of said first resistor is a value not more than a cycle time of said semiconductor circuit device.

5. The input protection circuit device according to claim 3, wherein said protection circuit unit further comprises a fourth impurity region of the second conductivity type formed so as to surround said third impurity region at said main surface, wherein said ground terminal is electrically connected to said fourth impurity region.

6. The input protection circuit device according to claim 3, wherein said protection circuit unit further comprises
    a fifth impurity region of the second conductivity type formed within said first impurity region at said main surface, and spaced apart from the other second impurity region, and a second gate electrode formed on said main surface sandwiched by said fifth impurity region and said other second impurity region with an insulation film thereunder, wherein said signal input unit is electrically connected to said fifth impurity region, and said second gate electrode is electrically connected to said first gate electrode.

7. The input protection circuit device according to claim 6, wherein said protection circuit unit further comprises a fourth impurity region of the second conductivity type formed at said main surface so as to surround said third impurity region, wherein said ground terminal is electrically connected to said fourth impurity region.

8. An input protection circuit device applied to a semiconductor circuit device connected to a power supply terminal and a ground terminal, said input protection circuit device comprising a power supply potential input unit, a ground potential application unit, and a protection circuit unit, wherein said protection circuit unit comprises a first impurity region of a second conductivity type formed at a main surface of a semiconductor substrate of a first conductivity type, and a pair of second impurity regions of the first conductivity type formed only within opposite sides of said first impurity region at said main surface and sandwiching an isolation insulation film, wherein said power supply potential input unit is electrically connected to one of said pair of second impurity regions, and said power supply terminal is electrically connected to the other of said pair of second impurity regions, and said protection circuit unit, said power supply potential input unit, and said ground potential application unit are arranged so as to be adjacent to each other.

9. The input protection circuit device according to claim 8, wherein said protection circuit unit further comprises a third impurity region of the second conductivity type formed within the first impurity region at said main surface, and isolated from said one second impurity region by an isolation insulation film, wherein said ground potential application unit is electrically connected to said third impurity region.

10. The input protection circuit device according to claim 9, wherein said protection circuit unit comprises a fourth impurity region of the second conductivity type formed at said main surface, a fifth impurity region of the first conductivity type formed within the fourth impurity region at said main surface, and a sixth impurity region formed within said fourth impurity region so as to surround said fifth impurity region at said main surface, and having an impurity concentration higher than that of said fourth impurity region, wherein said power supply potential input unit is electrically connected to said fifth impurity region and said ground potential application unit is electrically connected to said sixth impurity region.

11. The input protection circuit device according to claim 10, wherein said protection circuit unit comprises a seventh impurity region of the second conductivity type formed at said main surface, and an eighth impurity region of the first conductivity type formed within said seventh impurity region at said main surface, wherein said ground potential application unit is electrically connected to said eighth impurity region.

12. The input protection circuit device according to claim 9, wherein said protection circuit unit comprises a third impurity region of the second conductivity type formed at said main surface, a fourth impurity region of the first conductivity type formed within said third impurity region at said main surface, and a fifth impurity region of the second conductivity type formed within said third impurity region so as to surround said fourth impurity region at said main surface, and having an impurity concentration higher than that of said third impurity region, wherein said power supply potential input unit is electrically connected to said fourth impurity region, said ground potential application unit is electrically connected to said fifth impurity region.

13. The input protection circuit device according to claim 12, wherein said protection circuit unit comprises a sixth impurity region of the second conductivity type formed on said main surface, and a seventh impurity region of the first conductivity type formed within said sixth impurity region of said main surface, wherein said ground potential application unit is electrically connected to said seventh impurity region.

14. The input protection circuit device according to claim 8, wherein said protection circuit unit comprises a third impurity region of the second conductivity type formed at said main surface, and a fourth impurity region of the first conductivity type formed within said [seventh] third impurity region at said main surface, wherein said ground potential application unit is electrically connected to said fourth impurity region.

15. An input protection circuit device applied and connected to a semiconductor circuit device connected to a first power supply terminal and a second power supply terminal having a set voltage lower than a set voltage of said first power supply, said input protection circuit device comprising:

a first power supply potential input unit, a second power supply potential input unit, and a protection circuit unit, wherein said protection circuit unit comprises a first impurity region of a second conductivity type formed at a main surface of a semiconductor substrate of a first conductivity type, a second impurity region of the first conductivity type formed within said first impurity region at said main surface, and a third impurity region of the second conductivity type formed within said first impurity region at said main surface, and isolated from said second impurity region by an isolation insulation film, wherein said first power supply potential input unit is electrically connected to said second impurity region, said second power supply potential input unit is electrically connected to said third impurity region, and at least said protection circuit unit and said second power supply potential input unit are arranged so as to be adjacent to each other.

16. The input protection circuit device according to claim 15, wherein said protection circuit unit further comprises a fourth impurity region of the first conductivity type formed so as to surround said first impurity region at said main surface, and having an impurity concentration higher than that of a semiconductor substrate of the first conductivity type, and a fifth impurity region of the second conductivity type formed so as to surround said fourth impurity region at said main surface, wherein said fourth impurity region is electrically connected to said first power supply potential input unit, and said fifth impurity region is electrically connected to a ground potential.

* * * * *